(12) United States Patent
McTeer

(10) Patent No.: US 7,632,702 B2
(45) Date of Patent: *Dec. 15, 2009

(54) METHODS OF FORMING A RESISTANCE VARIABLE ELEMENT

(75) Inventor: Allen McTeer, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/189,543

(22) Filed: Aug. 11, 2008

(65) Prior Publication Data

US 2008/0299699 A1 Dec. 4, 2008

Related U.S. Application Data

(62) Division of application No. 11/473,856, filed on Jun. 23, 2006, now Pat. No. 7,422,927, which is a division of application No. 11/003,310, filed on Dec. 3, 2004, now Pat. No. 7,138,290.

(51) Int. Cl.
*H01L 21/00* (2006.01)

(52) U.S. Cl. .................. 438/95; 438/84; 438/93; 257/635; 257/636

(58) Field of Classification Search ............ 438/84, 438/93, 95, 907; 257/635, 636, 637
See application file for complete search history.

(56) References Cited

U.S. PATENT DOCUMENTS

| 4,132,614 | A | 1/1979 | Cuomo et al. |
|---|---|---|---|
| 4,233,514 | A * | 11/1980 | Kingsley ............ 250/370.01 |
| 6,348,365 | B1 | 2/2002 | Moore et al. |
| 6,570,172 | B2 | 5/2003 | Kim et al. |
| 6,646,902 | B2 | 11/2003 | Gilton et al. |
| 6,653,193 | B2 | 11/2003 | Gilton |
| 6,709,887 | B2 | 3/2004 | Moore et al. |
| 6,709,958 | B2 | 3/2004 | Li et al. |
| 6,710,423 | B2 | 3/2004 | Moore et al. |
| 6,727,192 | B2 | 4/2004 | Moore et al. |
| 6,730,547 | B2 | 5/2004 | Li et al. |
| 6,734,455 | B2 | 5/2004 | Li |
| 6,737,726 | B2 | 5/2004 | Gilton |

(Continued)

OTHER PUBLICATIONS

Bernheim et al., "Caesium Flooding on Metal Surfaces and Sputtered Negative Ion Yields", Journal De Physique, 1977, pp. 325-328.

(Continued)

*Primary Examiner*—Phuc T Dang
(74) *Attorney, Agent, or Firm*—Wells St. John P.S.

(57) ABSTRACT

The invention includes methods of depositing silver onto a metal selenide-comprising surface, and methods of forming a resistance variable device. In one implementation, a method of depositing silver onto a metal selenide-comprising surface includes providing a deposition chamber comprising a sputtering target and a substrate to be depositing upon. The target comprises silver, and the substrate comprises an exposed surface comprising metal selenide. Gaseous cesium is flowed to the target and a bombarding inert sputtering species is flowed to the target effective to sputter negative silver ions from the target. The sputtered negative silver ions are flowed to the exposed metal selenide-comprising surface effective to deposit a continuous and completely covering silver film on the exposed metal selenide of the substrate.

22 Claims, 5 Drawing Sheets

U.S. PATENT DOCUMENTS

| | | |
|---|---|---|
| 6,751,114 B2 | 6/2004 | Gilton et al. |
| 6,784,018 B2 | 8/2004 | Campbell et al. |
| 6,800,504 B2 | 10/2004 | Li et al. |
| 6,809,362 B2 | 10/2004 | Gilton |
| 6,867,114 B2 | 3/2005 | Moore et al. |
| 6,867,996 B2 | 3/2005 | Campbell et al. |
| 6,951,805 B2 | 10/2005 | Moore |
| 6,955,940 B2 | 10/2005 | Campbell et al. |
| 7,030,410 B2 | 4/2006 | Moore |
| 7,138,290 B2 * | 11/2006 | McTeer ........................ 438/95 |
| 2004/0038432 A1 | 2/2004 | Gilton |
| 2004/0043585 A1 | 3/2004 | Moore et al. |
| 2004/0082099 A1 | 4/2004 | Lin et al. |
| 2004/0192006 A1 | 9/2004 | Campbell et al. |

OTHER PUBLICATIONS

Meyer et al., "Ionization probability of atoms and molecules sputtered from a cesium covered silver surface", Applied Surface Science 2003, pp. 48-51.

US 6,613,701, 09/2003, Li et al. (withdrawn)

* cited by examiner

METHODS OF FORMING A RESISTANCE VARIABLE ELEMENT

RELATED PATENT DATA

This patent resulted from a divisional application of U.S. patent application Ser. No. 11/473,856, filed Jun. 23, 2006, entitled "Methods of Forming a Resistance Variable Element", naming Allen McTeer as inventor, now U.S. Pat. No. 7,422,927 which resulted from a divisional application of U.S. patent application Ser. No. 11/003,310, filed Dec. 3, 2004, entitled "Methods of Depositing Silver Onto a Metal Selenide-Comprising Surface and methods of Depositing Silver Onto a Selenium-Comprising Surface", naming Allen McTeer as inventor, now U.S. Pat. No. 7,138,290, the disclosures of which are incorporated by reference.

TECHNICAL FIELD

This invention relates to methods of depositing silver onto a metal selenide-comprising surface, to methods of depositing silver onto a selenium-comprising surface, and to methods of forming a resistance variable device.

BACKGROUND OF THE INVENTION

Recently, resistance variable memory elements, which include Programmable Conductive Random Access Memory (PCRAM), have been investigated for suitability as semi-volatile and non-volatile random access memory devices. A typical PCRAM device is disclosed in U.S. Pat. No. 6,348,365 to Moore and Gilton. In typical PCRAM devices, conductive material, such as silver, is incorporated into chalcogenide material. The resistance of the chalcogenide material can be programmed to stable higher resistance and lower resistance states. The unprogrammed PCRAM device is normally in a high resistance state. A write operation programs the PCRAM device to a lower resistance state by applying a voltage potential across the chalcogenide material.

The programmed lower resistance state can remain intact for an indefinite period, typically ranging from hours to weeks, after the voltage potentials are removed. The PCRAM device can be returned to its higher resistance state by applying a reverse voltage potential of about the same order of magnitude as used to write the element to the lower resistance state. Again, the higher resistance state is maintained in a semi-volatile manner once the voltage potential is removed. In this way, such a device can function as a resistance variable memory element having two resistance states, which can define two logic states.

A PCRAM device can incorporate a chalcogenide glass comprising germanium selenide ($Ge_xSe_{100-x}$). The germanium selenide glass may also incorporate silver (Ag) or silver selenide ($Ag_2Se$).

The amorphous nature of the chalcogenide glass material used in a PCRAM device has a direct bearing on its programming characteristics. Thus, the incorporation of silver into the chalcogenide glass requires precise control of the glass composition and silver concentration so as not to cause the chalcogenide glass to change from the desired amorphous state to a crystalline state.

Exemplary preferred resistance variable devices are described in U.S. patent application Ser. No. 10/819,315 filed on Apr. 7, 2004 (now US 2004/0192006A1), entitled "Layered Resistance Variable Memory Device and Method of Fabrication", naming Kristy A. Campbell, Jiutao Li, Allen McTeer and John T. Moore as inventors. Certain exemplary preferred embodiments of such application disclose Ag received over GeSe received over $Ag_2Se$ as a composite of some of the switchable resistance variable material received intermediate a pair of electrodes in a memory device. In certain instances, however, it may be desirable to form Ag directly on (with "on" in this document meaning in at least some direct physical contact) $Ag_2Se$. The preferred manner of depositing silver in the fabrication of such devices is by sputtering from a silver target. Unfortunately when sputtering silver directly onto a silver selenide surface, the silver tends to agglomerate providing discontinuous and otherwise less than complete covering of the silver over the $Ag_2Se$, even at deposition thicknesses on the magnitude of 2,000 Angstroms. Such silver agglomeration can cause subsequent processing problems during operation of such a memory cell. Use of a chalcogenide glass layer such as germanium selenide between the silver layer and the silver selenide tends to prevent such undesired silver agglomeration.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of depositing silver onto a metal selenide-comprising surface, methods of depositing silver onto a selenium-comprising surface, and methods of forming a resistance variable device. In one implementation, a method of depositing silver onto a metal selenide-comprising surface includes providing a deposition chamber comprising a sputtering target and a substrate to be depositing upon. The target comprises silver, and the substrate comprises an exposed surface comprising metal selenide. Gaseous cesium is flowed to the target and a bombarding inert sputtering species is flowed to the target effective to sputter negative silver ions from the target. The sputtered negative silver ions are flowed to the exposed metal selenide-comprising surface effective to deposit a continuous and completely covering silver film on the exposed metal selenide of the substrate.

In one implementation, a method of forming a resistance variable memory element includes forming a first electrode over a substrate. A layer comprising metal selenide is formed over the first electrode. The substrate with metal selenide-comprising layer is provided within a deposition chamber comprising a sputtering target. The target comprises silver, and metal selenide of the metal selenide-comprising layer is exposed within the deposition chamber. Gaseous cesium is flowed to the target and a bombarding inert sputtering species is flowed to the target effective to sputter negative silver ions from the target. The sputtered negative silver ions flow to the exposed metal selenide-comprising surface effective to deposit a silver film on the exposed metal selenide-comprising surface of the substrate.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The term "silver" is intended to include not only elemental silver, but also silver with other trace metals or in various alloy combinations with other metals as known in the semiconductor industry, as long as such silver alloy is conductive, and as long as the physical and electrical properties of the silver remain unchanged.

The term "metal selenide" is intended to include various species of metal selenide, including some species which have a slight excess or deficit of metal. For example, silver selenide species may be represented by the formula $Ag_{2+/-x}Se$. Though not being limited by a particular stoichiometric ratio between the metal and selenium, devices of the present invention typically comprise a metal, for example $Ag_{2+/-x}Se$ species where "x" ranges from about one to about zero.

The term "semi-volatile memory" is intended to include any memory device or element which is capable of maintaining its memory state after power is removed from the device for some period of time. Thus, semi-volatile memory devices are capable of retaining stored data after the power source is disconnected or removed. Accordingly, the term "semi-volatile memory" is also intended to include not only semi-volatile memory devices, but also non-volatile memory devices and those of low volatility.

The term "resistance variable material" is intended to include chalcogenide glasses and chalcogenide glasses comprising a metal, such as silver or metal ions. For instance, the term "resistance variable material" may include silver doped chalcogenide glasses, silver-germanium-selenide glasses, chalcogenide glass comprising a silver selenide layer, and non-doped chalcogenide glass, as well as such material incorporating metals in addition to or other than silver and/or germanium.

The term "resistance variable memory element" is intended to include any memory element, including Programmable Conductor Random Access Memory (PCRAM) elements which exhibit a resistance change in response to an applied voltage.

The term "chalcogenide glass" is intended to include glasses that comprise an element from group VIA (or group 16) of the periodic table. Group VIA elements, also referred to as chalcogens, include sulfur (S), selenium (Se), tellurium (Te), polonium (Po), and oxygen (O).

Figure 1:
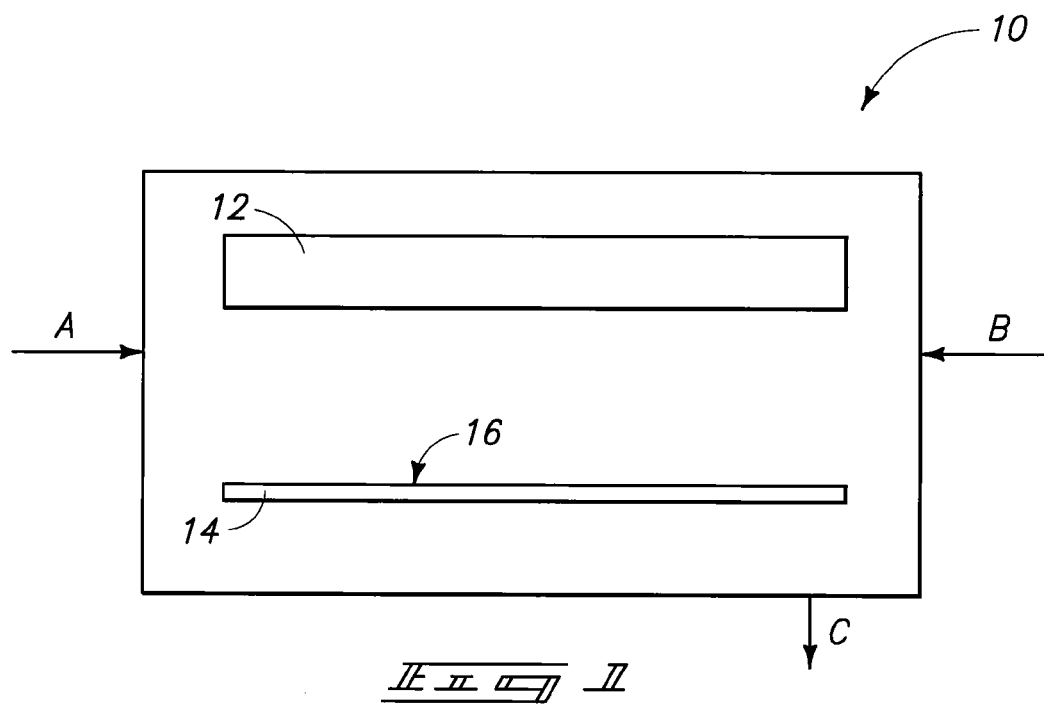
FIG. 1 is a diagrammatic view of a deposition chamber with a substrate therein in process in accordance with an aspect of the invention.

Exemplary first preferred embodiments of a method of depositing silver onto a metal selenide-comprising surface are initially described with reference to FIGS. 1 and 2. FIG. 1 diagrammatically depicts an exemplary deposition chamber 10 comprising a pair of exemplary gas inlets A and B and a gas outlet C. Deposition chamber 10 includes a sputtering target 12 comprising silver and a substrate 14 to be deposited upon. Substrate 14 comprises some exposed surface 16 which comprises a metal selenide. By way of example only, exemplary preferred metal selenides include silver selenide ($Ag_2Se$) and tin selenide ($Sn_2Se$). Substrate 14 might otherwise constitute any substrate, with an example being a semiconductor substrate, for example one including monocrystalline silicon and/or other semiconductive material(s). In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural, unless otherwise indicated.

Figure 2:
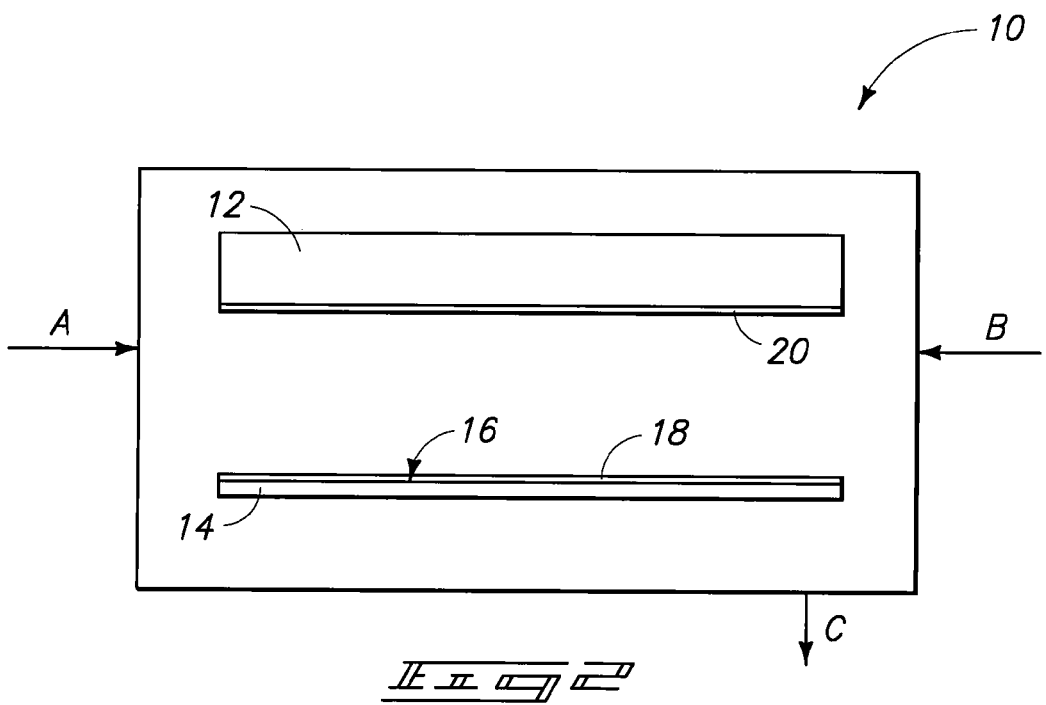
FIG. 2 is a view of the FIG. 1 chamber at a processing step subsequent to that depicted by FIG. 1.

Referring to FIG. 2, gaseous cesium has been flowed to target 12 and a bombarding inert sputtering species flowed to target 12 as well, effective to sputter negative silver ions from the target. Such sputtered negative silver ions have been flowed to exposed metal selenide-comprising surface 16 effective to deposit a continuous and completely covering silver film 18 on exposed metal selenide 16 of substrate 14. In the depicted preferred exemplary FIG. 2 embodiment, silver film 18 is completely covering and continuous over all of substrate 14, although the invention also of course contemplates in one implementation the continuous and complete covering of a silver film on exposed metal selenide which less than covers the entirety of the outer surface of substrate 14. For example, metal selenide might be masked or otherwise have been previously patterned such that exposed metal selenide is not received over the entirety of the substrate being deposited upon. In such instance, the silver film may or may not deposit over the entirety of the substrate. Preferably as shown, the gaseous cesium condenses onto target 12, forming a cesium layer 20 during the sputtering of negative silver ions from target 12. Preferably and typically, it is desired that very little cesium be incorporated into the deposited silver film 18. For example, preferably the cesium incorporation is from 0% to no greater than 1% atomic in film 18, and in one preferred implementation constitutes no detectable cesium being incorporated into deposited silver film 18.

The inert sputtering species preferably comprises a noble gas, with argon being a most preferred example. The inert sputtering species and gaseous cesium can be provided to the chamber by any suitable manner, for example and by way of example only, by flowing one of the inert sputtering species through one of inlets A or B, and the other of the gaseous cesium through the other of inlets A or B. The bombarding action of the inert sputtering species against the target can be imparted by any existing or yet-to-be developed manner. For example and by way of example only, a suitable negative voltage could be applied to target 12 during the sputtering action, for example at a negative 350 volts and at an applied power of from 1 watt to 10 kilowatts, with from 300 watts to 500 watts being a specific preferred example. Inert gas flow to the chamber might vary, by way of example only, from 5 to 50 sccm for a 2 ft³ volume deposition chamber. Magnetic or other enhancement might additionally be incorporated.

Cesium can be provided to the chamber by any suitable manner. For example and by way of example only, cesium can be evaporated from an ampoule, with the rate of evaporation and corresponding rate of feed of cesium to the chamber and target being regulated by the power/energy provided to the ampoule to impart cesium evaporation. An exemplary preferred temperature range of evaporator operation is from 130° C. to 170° C.

Further optionally, a bias might be provided to the substrate during the sputtering and deposit. An exemplary preferred bias is from, for example, zero volts (meaning essentially no bias) to some positive voltage value, for example from zero volts to about 300 positive volts.

Substrate temperature during the deposit is preferably no greater than 150° C., with a substrate temperature range of from 0° C. to 50° C. being a specific preferred example, and with a substrate temperature range of from 20° C. to 30° C. being even more preferred. Deposition chamber pressure during the sputtering and deposit is preferably from about 0.5 mTorr to about 2 mTorr.

Without being limited by any theory of invention, prior art sputtering of silver with, for example, argon is understood to generate from about 10% to 20% $Ag^+$ ions, 80% to 90% neutral Ag, and less than 1% of a combination of $Ag^-$ and $Ag^{2+}$ ions. Such sputtered silver when arriving at the metal selenide surface apparently tends to diffuse along the surface and agglomerate, resulting in a noncontinuous/discontinuous and uneven thickness film. However, cesium is very electronegative and if cesium is provided proximate the silver target, such readily gives up electrons. Accordingly, neutral silver coming off of the silver target can readily accept the electron from the cesium, thereby generating much more $Ag^-$ at the target surface than in the above prior processing where no cesium is provided within the deposition chamber, and thereby effectively sputtering negative silver ions from the target. In such instance, it is expected that the sputtered negative silver ions ($Ag^-$) will be from about 20% to 30%, from 60% to 70% neutral Ag, and from 5% to 10% $Ag^+$ ions. Accordingly, more than just $Ag^-$ is effectively sputtered from the target. Thereby in such example, the negative silver ions effectively sputtered from the target comprise a minority of all silver sputtered from the target during the cesium flowing, inert sputtering species bombarding, and the deposit of a silver film on the substrate. Where a suitable negative voltage is applied to the target/cathode surface, the $Ag^-$ ions coming off the target surface are repelled thereby. Energy thereby transferred to the $Ag^-$ can be larger in magnitude than what is generated from a typically negative biased substrate transferred to $Ag^+$ of the prior art to attract such positive ions. Further when the $Ag^-$ silver ions hit the surface, such tend to stick immediately instead of being allowed to diffuse along the surface that otherwise would tend to result in a non-continuous film of the prior art. Accordingly, quantity increase of such sticking negative ions tends to produce a smooth, continuous silver film on metal selenide.

Figure 3:
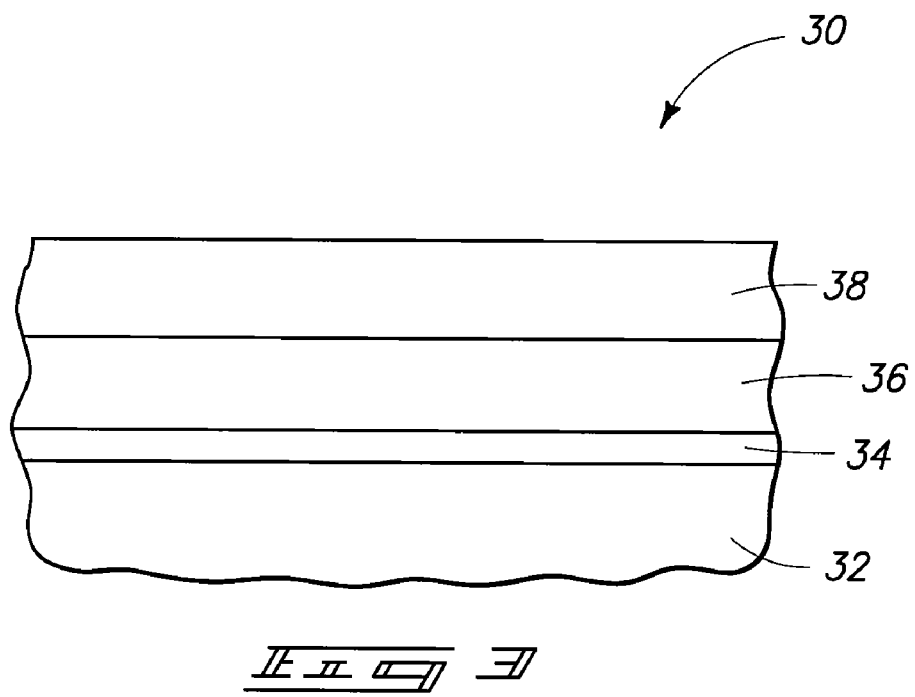
FIG. 3 is a diagrammatic sectional view of a semiconductor wafer fragment in process in accordance with an aspect of the invention.

By way of example only, such processing can be applied to the fabrication of a resistance variable memory element, for example as described above and as referred to in the above-referenced U.S. patent application Ser. No. 10/819,315 patent application. By way of example only, such is described with reference to FIGS. 3-10. FIG. 3 depicts a wafer fragment 30, for example a semiconductor substrate, comprising a silicon substrate 32. Of course, any semiconductor substrate or other substrate is contemplated. Further of course, any construction/structure is contemplated, with the figures referred to providing only one exemplary construction in the claimed method. FIG. 3 depicts an insulating layer 34 formed over semiconductor substrate 32. This and other layers, as will be inherent from the continuing discussion, may be formed by any known or yet-to-be developed deposition methods, for example by sputtering, chemical vapor deposition, plasma enhanced chemical vapor deposition, or physical vapor deposition. Exemplary materials for layer 34 include one or both of silicon oxides or silicon nitrides or low dielectric constant materials.

A first electrode 36 is formed over insulating layer 34. Such might comprise any conductive material, for example tungsten, nickel, tantalum, aluminum, platinum, conductive metal compounds and/or other materials. Another insulating layer 38 is shown formed over first electrode 36. Such might, of course, comprise the same or different material(s) as those described above with reference to insulating layer 34.

Figure 4:
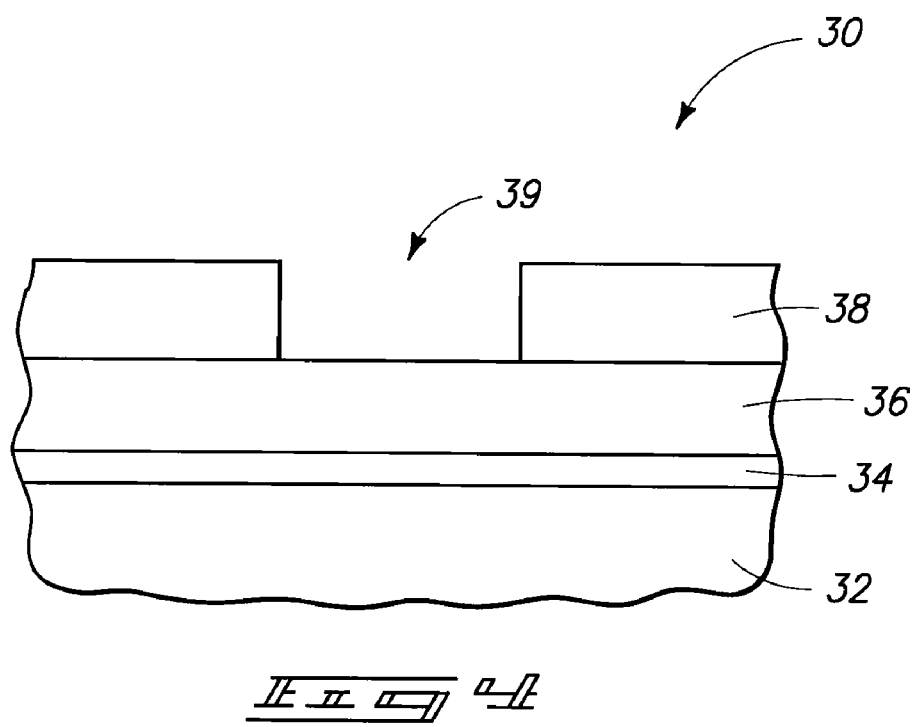
FIG. 4 is a view of the FIG. 3 wafer fragment at a processing step subsequent to that depicted by FIG. 3.

Referring to FIG. 4, an opening 39 extending to first electrode 36 has been formed in insulating layer 38. Such may be formed by any known or yet-to-be developed methods in the art, for example by conventional photolithographic patterning and etch.

Figure 5:
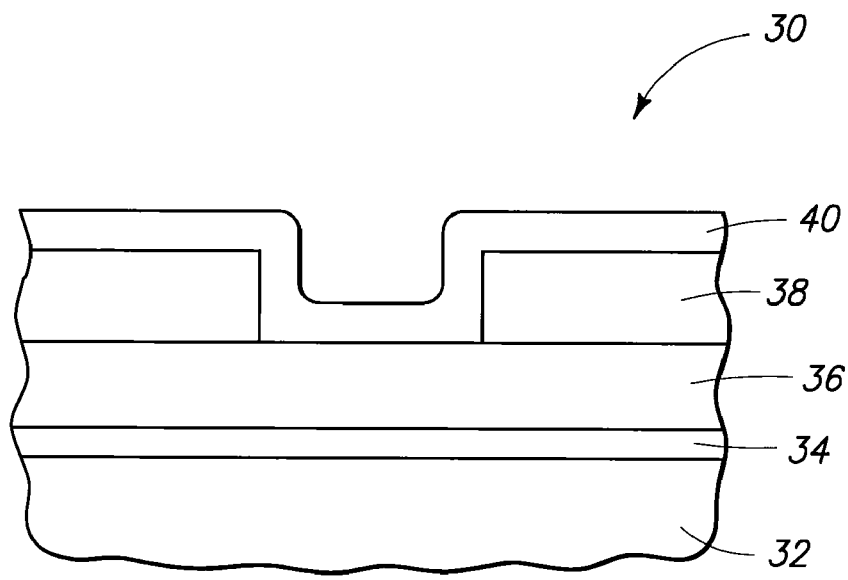
FIG. 5 is a view of the FIG. 4 wafer fragment at a processing step subsequent to that depicted by FIG. 4.

Referring to FIG. 5, a chalcogenide glass layer 40 has been deposited over insulating layer 38 to within opening 39. By way of example only, an exemplary preferred material for chalcogenide layer 40 is germanium selenide glass having a $Ge_xSe_{100-x}$ stoichiometry. A preferred stoichiometric range is between about $Ge_{20}Se_{80}$ to about $Ge_{43}Se_{57}$, with a specific preferred example being about $Ge_{40}Se_{60}$. An exemplary preferred thickness range for layer 40 is from about 100 Angstroms to about 1,000 Angstroms, with about 150 Angstroms being a specific preferred example.

Figure 6:
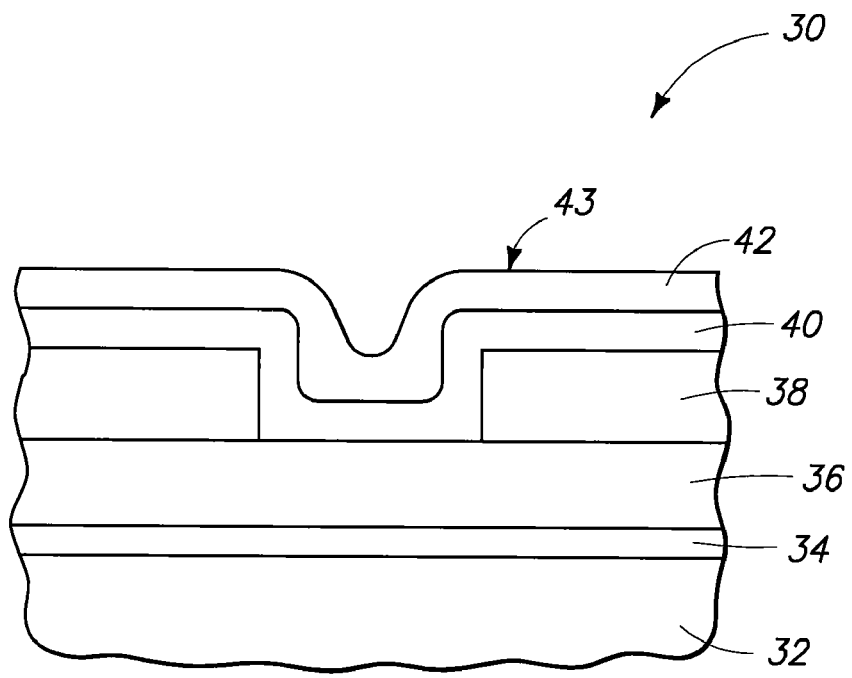
FIG. 6 is a view of the FIG. 5 wafer fragment at a processing step subsequent to that depicted by FIG. 5.

Referring to FIG. 6, a layer 42 comprising metal selenide has been formed over first electrode 36, and accordingly in the depicted preferred embodiment over chalcogenide glass layer 40. In the depicted example, metal selenide-comprising layer 40 comprises some outer exposed surface 43 comprising metal selenide. Exemplary preferred metal selenide materials include silver selenide and tin selenide. The formation of chalcogenide glass layer 40 may be accomplished by any suitable method. For example, germanium selenide glass can be formed by evaporation, co-sputtering germanium and selenide in the appropriate ratios, sputtering using a germanium selenide target having the desired stoichiometry, or chemical vapor deposition with stoichiometric amounts of $GeH_4$ and $SeH_2$ gasses (or various compositions of these gases and/or other suitable gases), which result in a germanium selenide film of a desired stoichiometry. A preferred thickness range for film 42 is from 200 Angstroms to 2,000 Angstroms.

Figure 7:
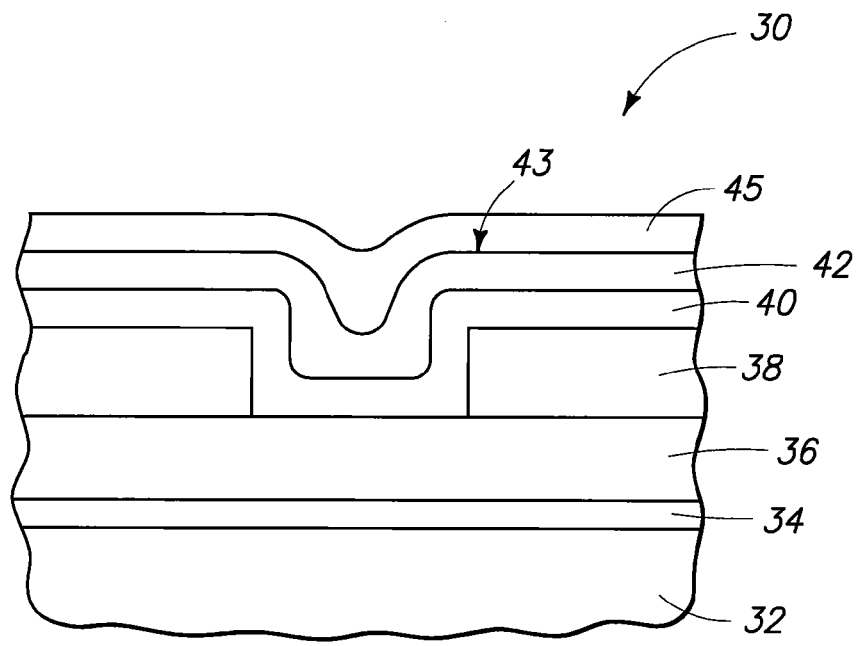
FIG. 7 is a view of the FIG. 6 wafer fragment at a processing step subsequent to that depicted by FIG. 6.

Referring to FIG. 7, the substrate 30 of FIG. 6 has been provided within a deposition chamber containing a silver-comprising sputtering target, for example the deposition chamber of FIG. 1 with the FIG. 6 substrate substituting for that of substrate 14 in FIG. 1. Gaseous cesium has been flowed to the target, as well a bombarding inert sputtering species flowed to the target, effective to sputter negative silver ions from the target. Such sputtered negative silver ions have been flowed to the exposed metal selenide-comprising surface 43 effective to deposit a silver film 45 on the exposed metal selenide-comprising surface 43 of substrate 30 (FIG. 7). In a most preferred embodiment of such a method of forming a resistance variable memory element, flowing of the sputtered negative silver ions is effective to deposit silver film 45 to be continuous and completely covering on the exposed metal selenide-comprising surface 43, although this is not a requirement in the broadest aspects of this implementation of the invention. Of course, more that just Ag⁻ ions are likely sputtered. Preferred attributes of forming such a layer 45 are otherwise as described above in the first-described embodiments.

Figure 8:
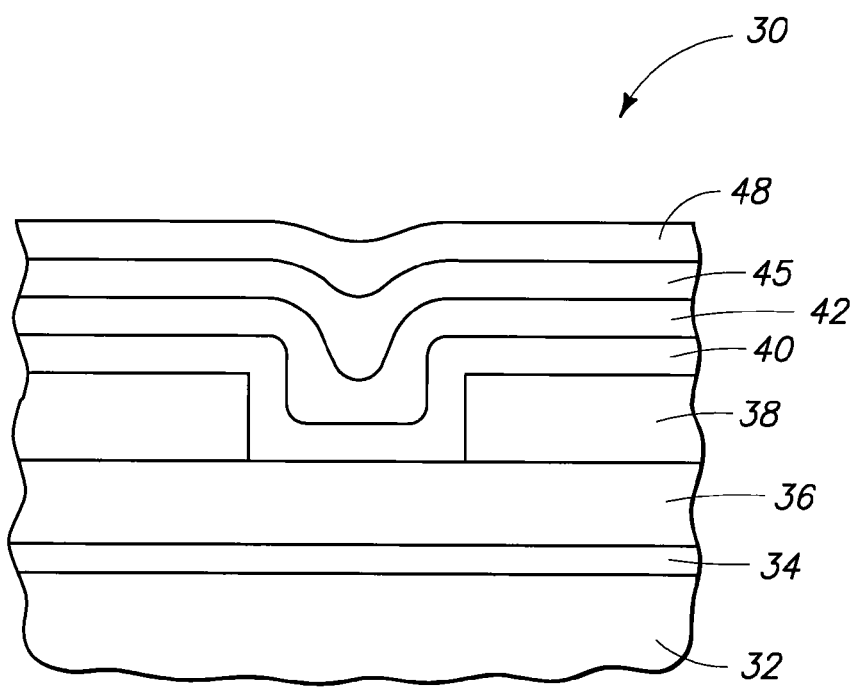
FIG. 8 is a view of the FIG. 7 wafer fragment at a processing step subsequent to that depicted by FIG. 7.

Silver film 45 might be deposited to a suitable thickness to function at least in part as a second electrode of the resistance variable memory element being formed. Alternately and more preferably, subsequent layers might be deposited, and an outer electrode formed thereover. For example, FIG. 8 depicts forming another chalcogenide glass layer 48 over silver film 45. An exemplary preferred thickness range for chalcogenide glass layer 48 is from 100 Angstroms to 1,000 Angstroms. In one implementation, layer 48 might comprise a conductive adhesion layer as described in the U.S. patent application Ser. No. 10/819,315 referred to above.

Figure 9:
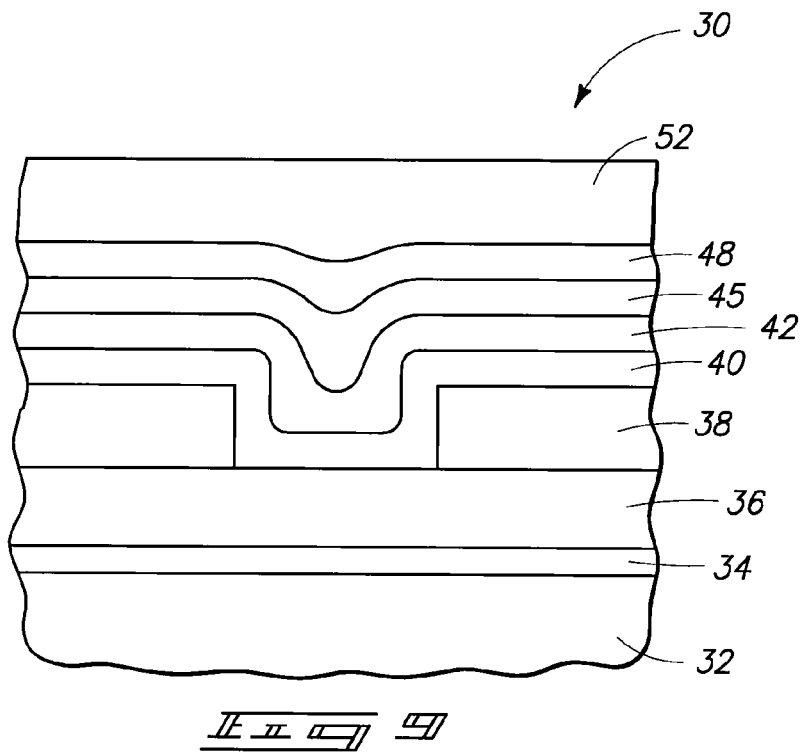
FIG. 9 is a view of the FIG. 8 wafer fragment at a processing step subsequent to that depicted by FIG. 8.

Referring to FIG. 9, a second electrode 52 is formed over chalcogenide glass layer 48, and accordingly over silver film 45. Second electrode 52 might comprise any electrically conductive material, for example the same as those described above with respect to first electrode 36. Of course, the first and second electrodes might constitute the same or different materials. Further preferably, the first and second electrodes might be chosen to considerably slow or prevent the migration of electrically conductive metals through the resistance variable memory element depicted in FIG. 9. Further of course, any one or combinations of the various layers depicted in FIG. 9 might have been patterned before or be patterned subsequent to the FIG. 9 substrate depiction. Further, fewer or additional conductive and/or chalcogenide layers (and/or other layers) might be utilized between first and second conductive electrodes 36 and 52, respectively, for example as described in the U.S. patent application Ser. No. 10/819,315 referred to above. Further, one or more conditioning steps as referred to in the Ser. No. 10/819,315 application could be employed.

The embodiments described immediately above refer to the formation of only a few possible resistance variable memory element structures in accordance with an aspect of the invention. Of course, the invention contemplates the formation of other resistance variable memory elements, for example which can be fabricated as a memory array and operated with memory element access circuits.

As described in the "Background" section above, one non-limiting motivation of certain aspects of the invention was to eliminate use of germanium selenide as an intervening layer between Ag and Ag₂Se to preclude undesired silver agglomeration. However, aspects of the invention also contemplate depositing silver onto selenium-comprising surfaces other than metal selenides. For example and by way of example only, aspects of the invention include depositing silver onto any selenium-comprising surface (of course including metal selenides), for example where such selenium is in at least one of elemental, compound (regardless of stoichiometry), and alloy forms. Such would, of course, include in one preferred example depositing silver onto a germanium selenide-comprising surface, and for example where germanium selenide is still utilized as an intervening layer between silver and a metal selenide. Preferred attributes of depositing silver onto a selenium-comprising surface are otherwise as described all above regarding methods of depositing silver onto a metal selenide-comprising surface, and as well as described all above with respect to methods of forming resistance variable memory elements.

Figure 10:
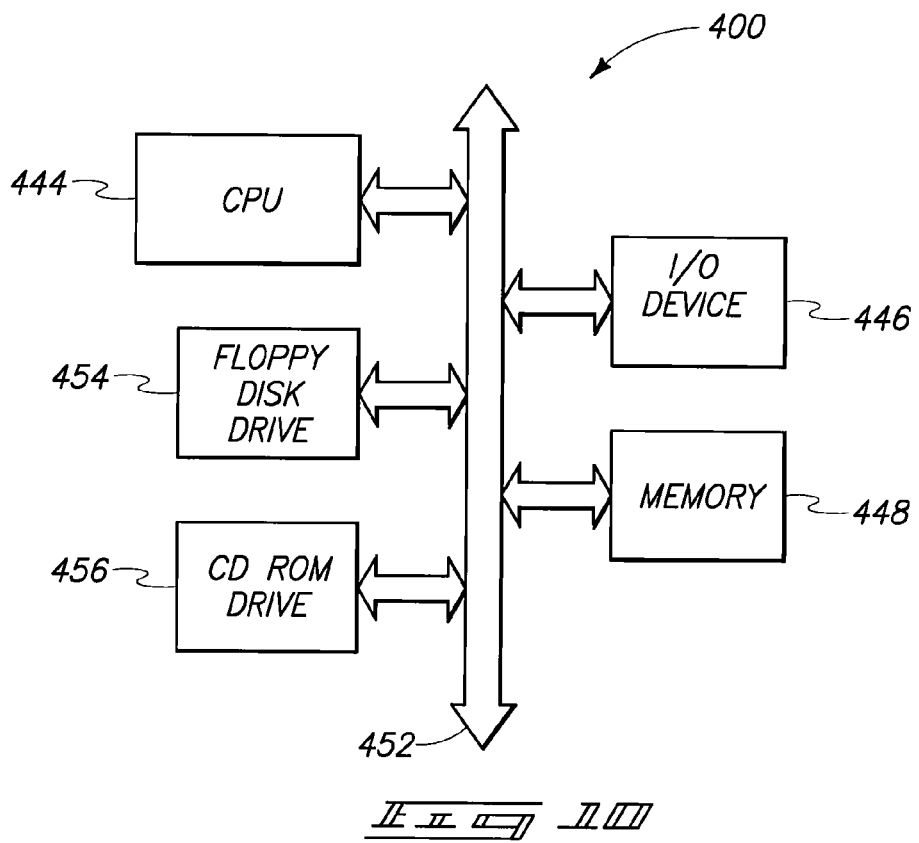
FIG. 10 illustrates a computer system having a memory element in accordance with an aspect of the invention.

FIG. 10 illustrates a typical processor system 400 which includes a memory circuit 448, for example a programmable conductor RAM, which employs resistant variable memory elements fabricated in accordance with aspects of the invention. A processor system, such as a computer system, generally comprises a central processing unit (CPU) 444, such as a microprocessor, a digital signal processor, or other programmable digital logic devices, which communicates with an input/output (I/O) device 446 over a bus 452. Memory 448 communicates with the system over bus 452, typically through a memory controller.

In the case of a computer system, the processor system may include peripheral devices such as a floppy disk drive 454 and a compact disk (CD) ROM drive 456, which also communicate with CPU 444 over the bus 452. Memory 448 is preferably constructed as an integrated circuit, which includes one or more resistance variable memory elements fabricated as described above. If desired, memory 448 may be combined with the processor, for example CPU 444, in a single integrated circuit.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a resistance variable memory element, comprising:
    forming a first electrode over a substrate;
    forming a layer comprising selenium over the first electrode;
    providing the substrate with selenium-comprising layer within a deposition chamber comprising a sputtering target, the target comprising silver, selenium of the selenium-comprising layer being exposed within the deposition chamber;
    flowing gaseous cesium to the target and a bombarding inert sputtering species to the target effective to sputter negative silver ions from the target; and
    flowing the sputtered negative silver ions to the exposed selenium-comprising surface effective to deposit a silver film on the exposed selenium-comprising surface of the substrate.

2. The method of claim 1 wherein exposed selenium of the selenium-comprising layer is in at least one of elemental, compound and alloy forms.

3. The method of claim 1 wherein exposed selenium of the selenium comprising layer comprises germanium selenide.

4. The method of claim 1 wherein the flowing of the sputtered negative silver ions is effective to deposit the silver film to be continuous and completely covering on the exposed selenium-comprising surface.

5. The method of claim 1 comprising forming a second electrode layer over the deposited silver film.

6. The method of claim 1 wherein the gaseous cesium condenses onto the target during the sputtering of negative silver ions from the target.

7. The method of claim 1 wherein the inert sputtering species comprises a noble gas.

8. The method of claim 7 wherein the noble gas comprises argon.

9. The method of claim 1 wherein substrate temperature during the deposit is no greater than 150° C.

10. The method of claim 9 wherein substrate temperature during the deposit is from 0° C. to 50° C.

11. The method of claim 9 wherein substrate temperature during the deposit is from 20° C. to 30° C.

12. The method of claim 1 wherein deposition chamber pressure is from about 0.5 mTorr to about 2 mTorr during the deposit.

13. The method of claim 1 comprising applying a negative voltage to the target during the sputtering of negative silver ions from the target.

14. The method of claim 1 comprising applying a bias to the substrate of from 0 Volts to about 300 positive Volts during the deposit.

15. The method of claim 1 comprising applying a positive voltage bias to the substrate during the deposit.

16. The method of claim 15 comprising applying a negative voltage to the target during the sputtering of negative silver ions from the target.

17. The method of claim 1 wherein the negative silver ions sputtered from the target comprise a minority of all silver sputtered from the target during said flowing.

18. The method of claim 17 wherein the negative silver ions sputtered from the target comprise from about 20 atomic percent to 30 atomic percent of all silver sputtered from the target during said flowing.

19. The method of claim 1 wherein cesium incorporation into the deposited silver film is from 0% atomic to no greater than 1% atomic.

20. The method of claim 19 wherein no detectable cesium is incorporated into the deposited silver film.

21. The method of claim 1 comprising forming a chalcogenide glass layer over the first electrode, and forming the selenide-comprising layer on the chalcogenide glass layer.

22. The method of claim 21 comprising forming another chalcogenide glass layer over the silver film.

* * * * *